United States Patent
Lutz et al.

(10) Patent No.: US 7,655,498 B2
(45) Date of Patent: Feb. 2, 2010

(54) FILM COMPRISING ORGANIC SEMICONDUCTORS

(75) Inventors: Norbert Lutz, Rückersdorf (DE);
Heinrich Wild, Herzogenaurach (DE);
Ludwig Brehm, Adelsdorf (DE)

(73) Assignee: Leonhard Kurz Stiftung & Co. KG, Furth (DE)

( * ) Notice: Subject to any disclaimer, the term of this patent is extended or adjusted under 35 U.S.C. 154(b) by 669 days.

(21) Appl. No.: 10/529,458

(22) PCT Filed: Sep. 30, 2003

(86) PCT No.: PCT/DE03/03258

§ 371 (c)(1),
(2), (4) Date: Apr. 3, 2006

(87) PCT Pub. No.: WO2004/032257

PCT Pub. Date: Apr. 15, 2004

(65) Prior Publication Data

US 2006/0180805 A1    Aug. 17, 2006

(30) Foreign Application Priority Data

Oct. 2, 2002 (DE) .................. 102 46 241

(51) Int. Cl.
*H01L 51/40* (2006.01)
(52) U.S. Cl. .............. 438/99; 257/40; 257/E51.018
(58) Field of Classification Search ................. 438/99
See application file for complete search history.

(56) References Cited

U.S. PATENT DOCUMENTS

| 6,586,791 B1 * | 7/2003 | Lee et al. .................. 257/295 |
| 6,814,898 B1 * | 11/2004 | Deeman et al. ............ 264/1.33 |
| 7,229,868 B2 * | 6/2007 | Bernds et al. .............. 438/197 |
| 2002/0033918 A1 * | 3/2002 | Shigeno et al. ............ 349/114 |
| 2003/0134487 A1 | 7/2003 | Breen et al. |

FOREIGN PATENT DOCUMENTS

| DE | 100 33 112 A1 | 1/2002 |
| DE | 102 19 905 A1 | 12/2003 |
| EP | 0 442 123 A1 | 8/1991 |
| WO | WO 99/44229 | 9/1999 |
| WO | WO 01/08241 | 2/2001 |
| WO | WO 02/25750 A1 | 3/2002 |
| WO | WO 02/47183 A1 | 6/2002 |

OTHER PUBLICATIONS

High Performance Polymer Light-Emitting Diodes Fabricated by a Low Temperature Lamination Process, *Advanced Functional Materials*, Oct. 2001, vol. 11, No. 5, pp. 339-343.

* cited by examiner

*Primary Examiner*—Wai-Sing Louie
(74) *Attorney, Agent, or Firm*—Hoffmann & Baron, LLP

(57) ABSTRACT

The invention concerns a film (1), in particular a stamping or laminating film, and a process for the production of such a film. At least one component produced using organic semiconductor technology, in particular one or more organic field effect transistors, is integrated into a film (1).

8 Claims, 14 Drawing Sheets

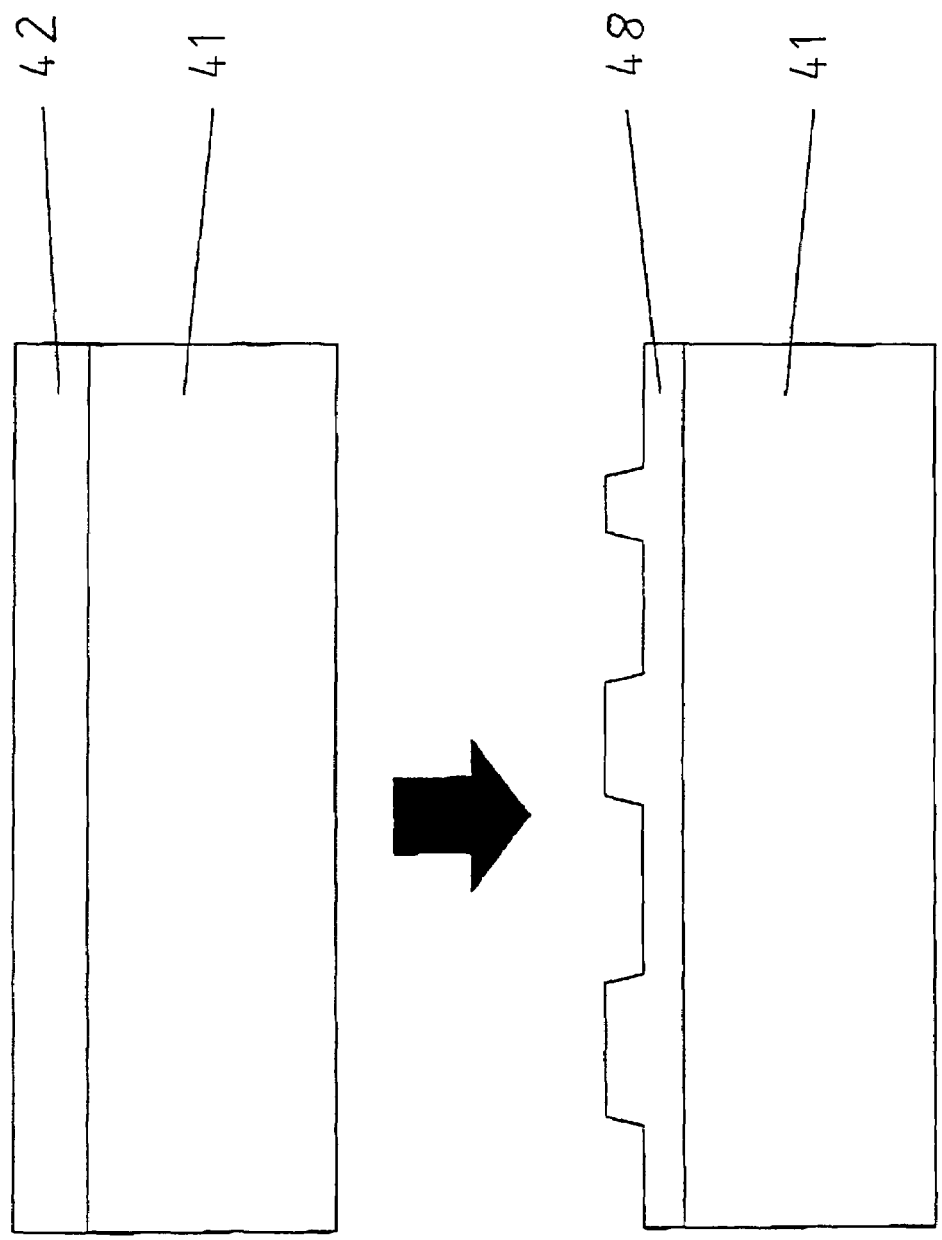

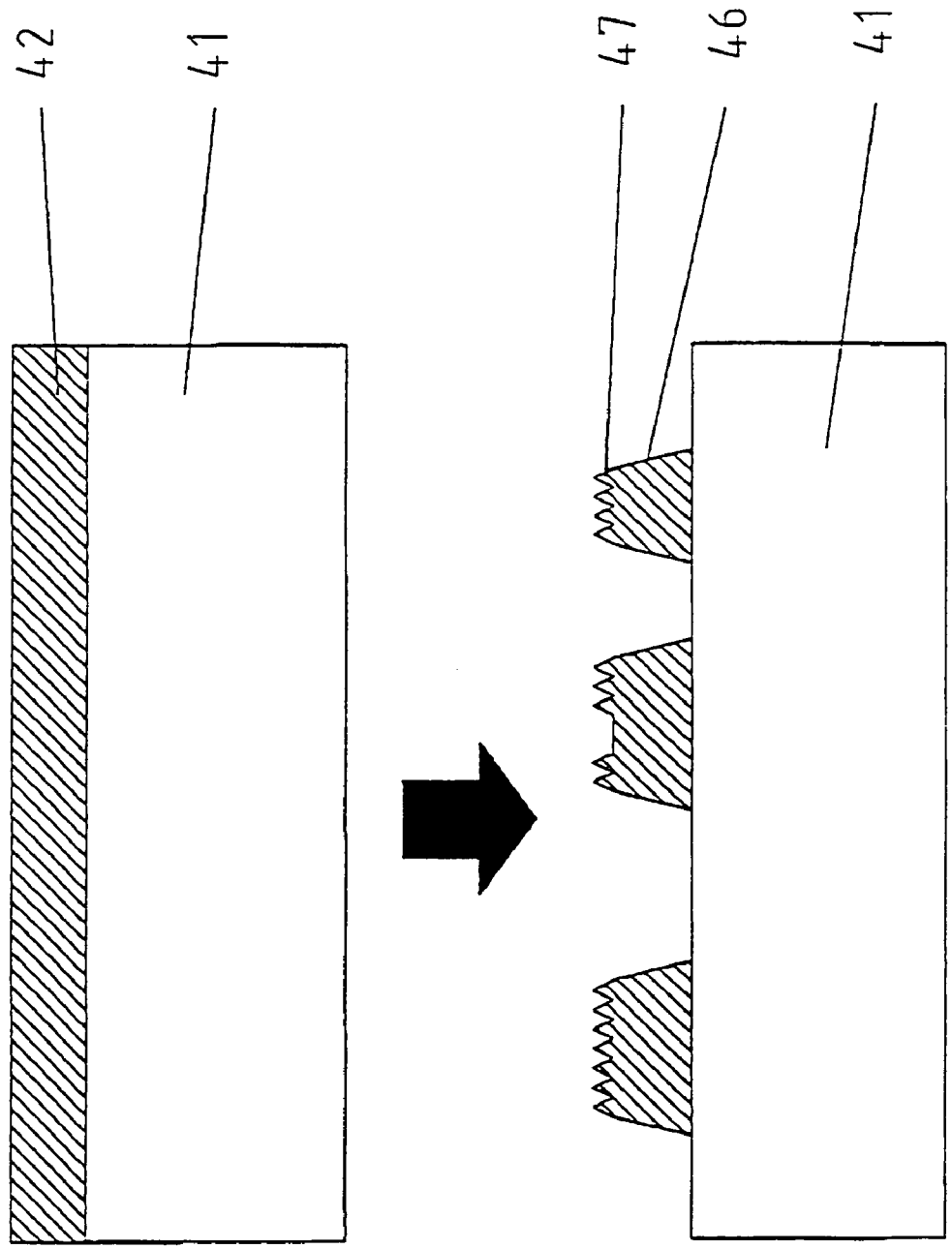

FILM COMPRISING ORGANIC SEMICONDUCTORS

This application claims priority based on an International Application filed under the Patent Cooperation Treaty, PCT/DE03/03258, filed on Sep. 30, 2003, and German Patent Application No. 102 46 201.0, filed on Oct. 2, 2002.

BACKGROUND OF THE INVENTION

Organic field effect transistors (OFETs) comprise an organic semiconductor layer between and over a source electrode and at least one drain electrode, an organic insulating layer over the semiconductor layer and a gate electrode. The source, drain and gate electrodes can comprise metals or organic conductive polymers. Organic electrode materials are for example polyaniline and polypyrrole. For example, polythiophene is used as the semiconductor and polyvinylphenol is used as the insulator.

Structuring of the conductive electrode layers is required for the production of OFETs or other components of organic polymers. Structuring of the other layers is not absolutely necessary but can improve the efficiency and performance of the components consisting of organic polymers.

WO 02/25750 describes the production of electrodes or conductor tracks using a lithography process. In that case the conductive organic layer of doped polyaniline (PANI) or polyethylene dioxythiophene (PEDOT) is applied to the substrate, for example a film, over an area thereof, by application by means of a doctor, by being sprayed on, by spin coating or by screen printing. A thin layer of photoresist is applied thereto and exposed in structured configuration. Upon development the exposed polyaniline layer is deprotonised by the action of the developer and thus becomes non-conducting. The photoresist which has remained is dissolved with a solvent. Prior to or after that step, the non-conductive matrix of the organic layer is dissolved out with a non-basic solvent.

Alternatively it is also possible for the exposed regions to be oxidatively removed prior to dissolution of the photoresist by reactive etching.

WO 02/25750 also describes that a chemical compound which has a deprotonising effect is applied by printing to the areal functional polymer layer, for structuring purposes. The compound is preferably a base. Non-conducting regions are selectively removed by subsequent rinsing.

There is the disadvantage that the lithographic process only works for the material polyaniline. In addition, it is not known in the state of the art for roll material to be structured with lithographic processes. With other structuring processes, for example printing, the minimum possible distance between the source and drain electrodes is at least between 30 μm and 50 μm. However endeavours are made to achieve lengths of approximately 10 μm in order to increase the performance and efficiency of the OFET.

WO 02/47183 proposes introducing the functional polymer into recesses in a shaping layer, for structuring the conductive organic layer and the other layers in an OFET. The shaping layer comprises a different organic material with insulating properties, into which a punch is pressed. That material is for example an UV-hardenable or heat-hardenable lacquer which is applied to a substrate over the full surface area thereof. The lacquer is hardened by irradiation, for example by means of UV light, and recesses are then produced in the shaping layer. The functional polymer is then scraped into those recesses. That process makes it possible therefore to produce extremely fine structures with lateral dimensions in the region of 2-5 μm. The scraping method is also not material-specific, that is to say it is suitable for the structuring of all layers of an OFET. Besides polyaniline, other conductive or semiconducting organic materials such as for example polypyrrole, polythiophene or also polyvinylphenol can be scraped into the recesses and thus structured. In addition the viscosity range for the scraping operation is incomparably greater than for the printing operation so that the functional polymers can be left substantially in their consistency. In addition relatively thick layers in the range of up to 1 μm can be produced. It is further proposed that the process is used in a continuous rolling printing operation. In that case the band comprises a substrate material with a shaping polymer applied thereto, which can be an UV-hardenable lacquer but also a heat-hardenable lacquer. The recesses are initially embossed therein with a stamping roller and the shaping polymer is subjected to initial hardening by UV irradiation. The lacquer is finally hardened with an UV lamp arranged thereafter. The functional polymer is then scraped into the structured lacquer, with a doctor scraper.

DE 100 33 112 describes a process which takes off the functional polymer which has been introduced into the shaping mold by means of a tampon and then applies it to the substrate or layers which are already present.

SUMMARY OF THE INVENTION

Now, the object of the invention is to improve the production of efficient components using organic semiconductor technology and/or to provide for the construction of improved components using organic semiconductor technology.

That object is attained by a film, in particular by a stamping film, laminating film or a film element, which includes at least one component using organic semiconductor technology, in particular one or more organic field effect transistors (OFETs=OrganicFET). That object is further attained by a process for the production of such a film, in which structuring of one or more layers of the at least one component of organic semiconductor technology is effected by thermal replication or UV replication.

The production of electronic circuits using organic semiconductor technology, not as previously conventional on a wafer but as part of a film, affords major advantages in terms of production technology. Tried and tested methods of film technology and existing production installations can be used for the production of such electronic circuits, thereby affording considerable cost advantages.

Particular advantages are enjoyed in the implementation of such components using organic semiconductor technology, in stamping or laminating films. That affords the option of applying electronic circuits of that kind to products and intermediate products in many different ways. This provides an intermediate product which is inexpensive to produce and which can be further used and adapted in customer-specific fashion, in many different ways. The production process is made more flexible as a result and production costs are reduced. It has further been found that the film technology and production processes used for the manufacture of stamping and laminating films are particularly well suited to producing electronic circuits of that kind.

In accordance with a preferred embodiment of the invention such a stamping film, laminating film or film element has a carrier film, at least one layer comprising an organic semiconductor material, in particular polythiophene, at least one layer comprising an electrically insulating material and two or more layers of an electrically conductive material which are shaped in a region-wise and pattern configuration and which act as electrode layers. In that case the electrically conductive layers preferably comprise an organically conductive material, in particular polyaniline or polypyrrole. The electrically insulating layer preferably comprises an organic insulation material, in particular polyvinylphenol. In addition the film preferably has a release layer and an adhesive layer, as well as one or more lacquer layers adjoining the functional polymer layers.

Further advantages can be achieved if the electrically conductive layer, the layer consisting of a semiconductor material and the insulation layer are generally transparent. In that way it is possible for the optical appearance of the film to be influenced by the configuration of further layers of the stamping or laminating film and to simplify multiple use of the film, for example as an electronic circuit and as a decorative element.

In accordance with a preferred embodiment of the invention, an electrical functionality, in particular that of at least one electronic component produced using organic semiconductor technology, is combined in the film with optical features. Accordingly on the one hand the film has an electronic circuit with one or more electronic components using organic semiconductor technology while on the other hand it provides the observer with one or more optical (security) features. For that purpose for example the film can have a spatial structure which is shaped between layers of the film and which on the one hand structures in a pattern configuration a layer of an organic component produced using organic semiconductor technology and which on the other hand generates an optical-diffraction effect which forms an optical feature. In that case the spatial structure can be formed by the superimposition of a macrostructure and a microstructure, wherein the macrostructure is responsible for the patterned structuring of an electrical functional layer and the microstructure is responsible for the production of an optical-diffraction effect and thus for the generation of an optical (security) feature. Thus, a spatial structure affords two functions, on the one hand implementation of an electronic component using organic semiconductor technology and on the other hand the generation of an optical feature for the person viewing the film.

In addition the film can have one or more holographic-optical or diffractive layers for producing an optical-diffraction security feature, one or more thin-film layer sequences for producing an optical security feature by means of interference and one or more decorative layers, by means of which, in addition to the electrical functionality, it provides an optical functionality, for example the generation of one or more optical (security) features or decorative effects.

A film of such a design configuration can thus serve as an optical security element, for example for safeguarding identity cards or passes, banknotes, credit cards or cash cards, as well as articles. In that respect such a film, besides optical security features, can also afford electrical security features. The level of security against forgery is considerably increased by the combination of such optical and electrical security features. In addition it is also possible for the film to have two or more mutually superposed layers which produce an optical security feature, wherein one or more functional layers of an electronic component of organic semiconductor technology are arranged between optically active layers of that nature. That considerably increases the level of security in relation to forgery as any attempt at manipulation of the optical or the electrical security feature is immediately detectable and thus those security features protect each other.

A particularly effective and inexpensive way of producing a film according to the invention provides that structuring of one or more layers of the at least one component produced using organic semiconductor technology is implemented by thermal replication or UV replication.

In accordance with a preferred embodiment of the invention a spatial structure is replicated in the layer to be replicated, the structure depth of said structure being greater than or equal to the thickness of the layer to be replicated so that the layer to be replicated is partially completely severed by the replication procedure. Thus the replication operation provides an electrical functional layer which is structured in a pattern configuration in accordance with the spatial structure. That process makes it possible to achieve very high levels of resolution, for example in the region of between 10 µm and 100 nm. By virtue of the possibility of being able to produce such small structures, the packing density and also the performance and efficiency of the electrical circuits implemented can be improved. Further advantages of this process are that a high-resolution structuring of an electrical functional layer is possible in a single step. Structuring of the electrical functional layer can be effected at high speed, in particular in the form of a roll-to-roll process, and at comparatively low production costs.

In accordance with a further preferred embodiment of the invention, replicated into the layer to be replicated is a spatial structure whose structure depth is less than the thickness of the layer to be replicated. Applied to the replicated layer is an electrical functional layer comprising a material which upon hardening experiences a pre-defined reduction in volume. That material is applied to the replicated layer in an application amount which is so selected that, by virtue of the reduction in volume upon hardening, a functional layer which is structured in a pattern configuration in accordance with the replicated structure remains behind. In addition it is also possible in this case for an electrical functional layer to be applied to the replicated layer and for the electrical functional layer then to be removed to a depth which is so selected that, after removal, a functional layer which is structured in a pattern configuration in accordance with the replicated structure is left behind. A process of that nature also makes it possible to achieve high levels of resolution of electrical functional layers so that the advantages described hereinbefore in that respect are also enjoyed with this procedure.

Alternatively or additionally it is also possible for one or more of the electrode, insulation and semiconducting layers required for the components to function to be introduced into the film structure over part of the area or the entire area thereof by printing processes, in particular by tampon printing.

BRIEF DESCRIPTION OF THE DRAWINGS

The invention is described by way of example hereinafter by means of a number of embodiments with reference to the accompanying drawings.

FIG. 8a shows a functional view of the replication of a layer of a component produced using organic semiconductor technology in accordance with a further embodiment.

DESCRIPTION OF THE PREFERRED EMBODIMENTS

Figure 1:
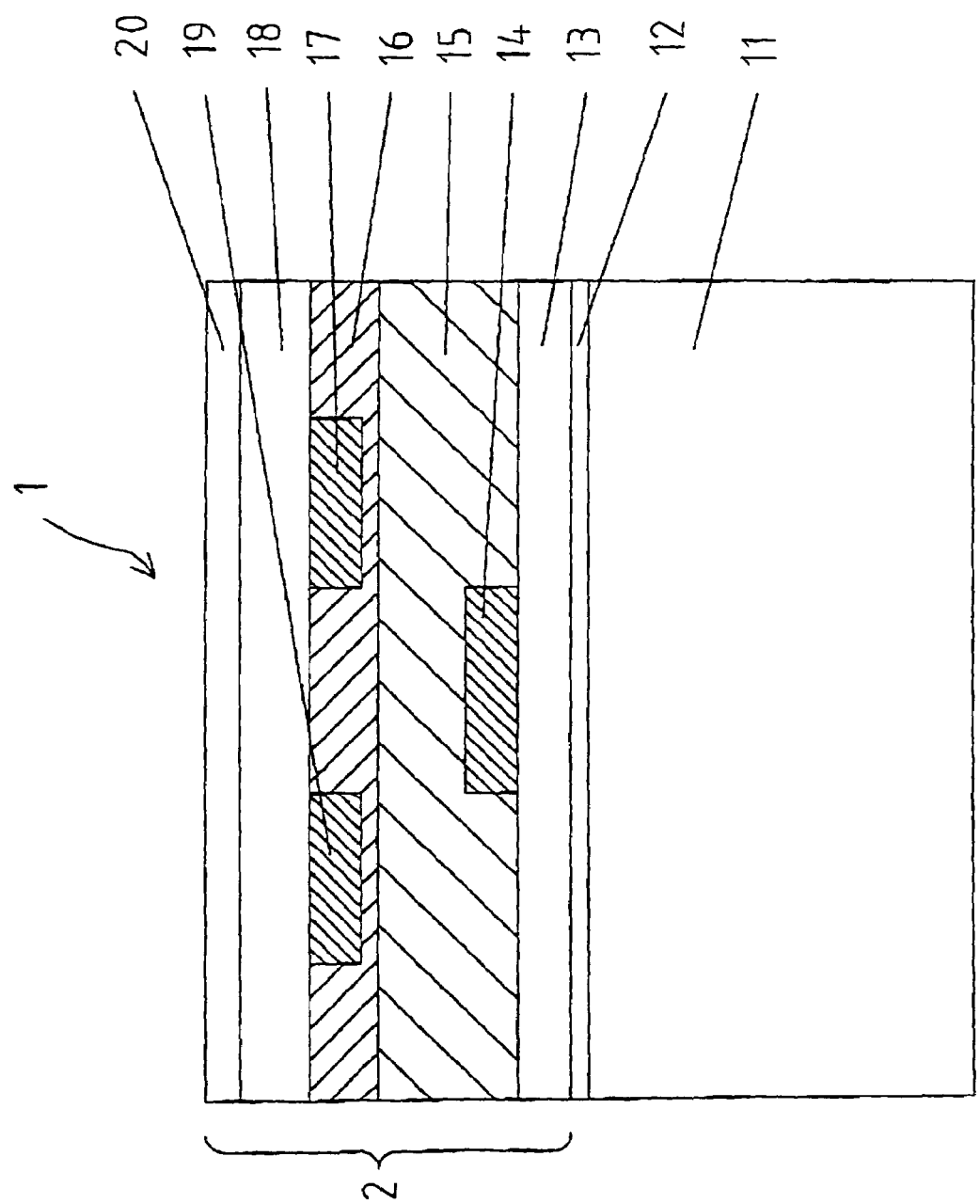
FIG. 1 shows a sectional view of a film according to the invention for a first embodiment of the invention.
Figure 2:
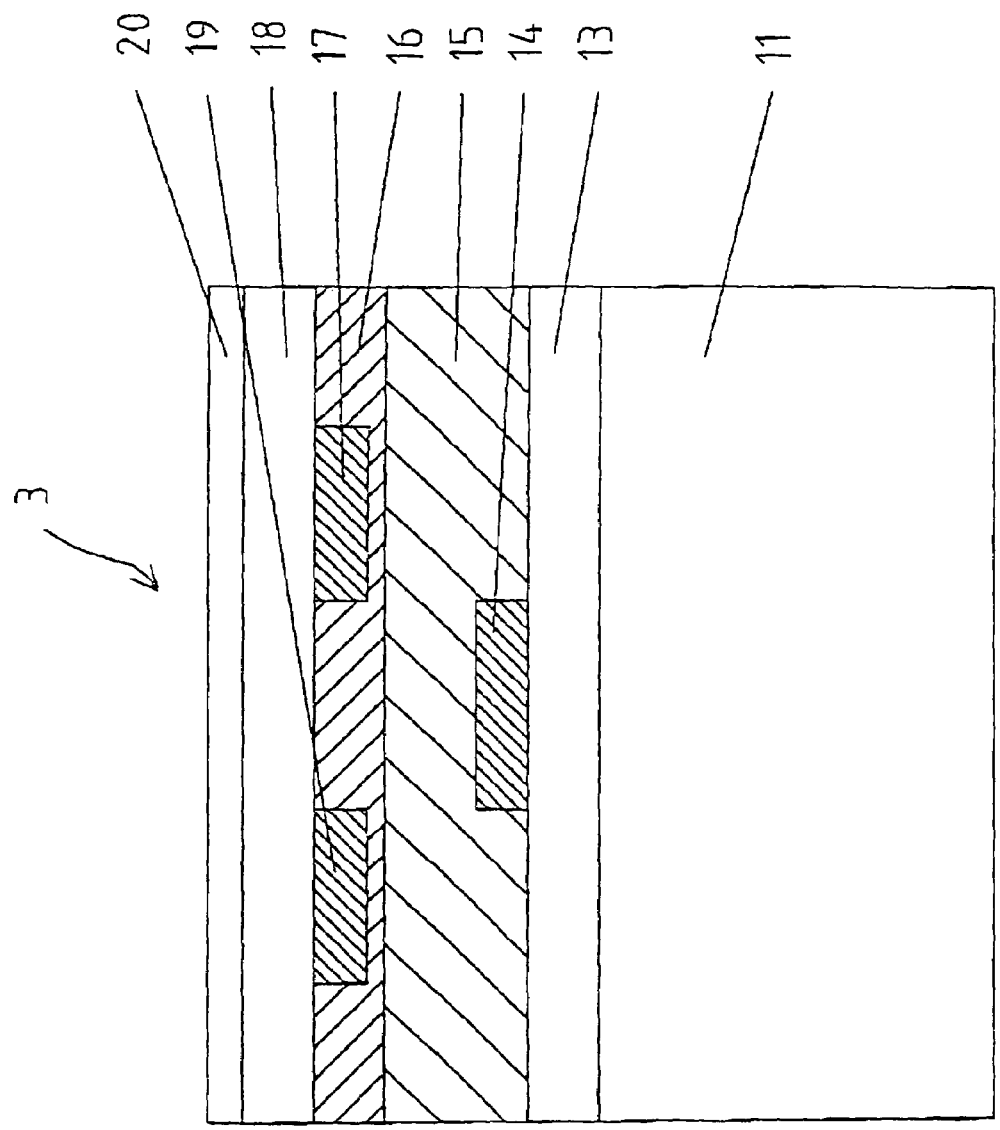
FIG. 2 shows a sectional view of a film according to the invention for a further embodiment of the invention.

FIG. 1 shows a stamping film which includes at least one component produced using organic semiconductor technology, in particular organic field effect transistors (OFETs). Such a stamping film is in particular a hot stamping film. FIG. 2 shows the structure of a laminating film which includes at least one component produced using organic semiconductor technology, in particular organic field effect transistors (OFETs). The invention however is not restricted to such types of film.

FIG. 1 shows a stamping film 1 comprising a carrier film 11 and a transfer layer portion 2 applied thereto. Provided between the carrier film 11 and the transfer layer portion 2 is a release layer 12 which serves to facilitate release of the transfer layer portion 2 from the carrier film 11. In that respect it would also be possible to omit the release layer 12.

The transfer layer portion 2 has a first lacquer layer 13 and a second lacquer layer 18, an insulation layer 15 comprising an electrically insulating material and a layer 16 of an organic semiconductor material. In addition the transfer layer portion 2 has two electrode layers which are shaped in a pattern configuration and which comprise an electrically conductive material, of which FIG. 1 shows a partial region 14 forming a gate electrode and two partial regions 17 and 19 forming a source electrode and a drain electrode respectively.

Alternatively it is also possible for the arrangement of the gate or the source and drain electrodes in the transfer layer portion 2 to be interchanged, that is to say the source and drain electrodes can be disposed downwardly in the drawing over the lacquer layer 13 and the gate electrode can be disposed upwardly in the drawing beside and over the semiconductor layer 16.

FIG. 2 shows a laminating film 3 involving a similar layer structure. The precise structure of the layers is thus described hereinafter only with reference to the stamping film 1.

The carrier film 11 is a plastic film of a thickness of between 6 μm and 200 μm, preferably of a thickness of between 19 μm and 38 μm. The carrier film 11 is preferably a polyester film.

The release layer 12 is then applied to the carrier film 11 over the full surface area thereof, in a thickness of between 0.01 and 0.2 μm. It is preferably in the form of a layer which becomes soft in the development of heat and which, upon application of the hot stamping film to the substrate, allows release of the further layers from the carrier film 11.

The first lacquer layer 13 is a protective lacquer layer which is generally applied to the release layer over the full surface area, more specifically in a layer thickness of between 0.5 and 5.0 μm, preferably between 1 and 2 μm.

The first electrode layer with the gate electrode 14 is now applied to the lacquer layer 13. In this case the first electrode layer preferably comprises an electrically conductive polymer, preferably polyaniline and polypyrrole. It is further possible to use metals, for example gold or silver, for the first electrode layer.

In this case the first electrode layer can already be partially applied to the lacquer layer 13 in a pattern configuration for example by a printing process (intaglio printing, screen printing) or by a coating process. It is however also possible for the first electrode layer to be applied to the lacquer layer 13 over the full area or part of the area thereof and then to be partially removed again by a replication process described hereinafter, by an exposure and etching process or by ablation, for example by means of a pulsed laser.

Depending on the respective application process employed, in that procedure the electrically conductive material is applied to the lacquer layer 13 in fluid form, in dissolved form or as a suspension.

The insulation layer 15 preferably comprises an organic insulation material, for example polyvinylphenol. It is however also possible to use oxide layers, for example metal oxides, as the material for the insulation layer 15. In that case organic insulation layers are applied by means of one of the above-described processes to the electrode layer which is structured in a pattern configuration, in fluid form, dissolved form or as a suspension. The insulation layer 15 is then solidified by drying or in some other manner. Oxide layers are applied by thermal vapor deposition or vacuum sputtering.

The layer 16 comprising an organic semiconductor material is now applied to the insulation layer 15 over the full area or part of its area. In that respect polythiophene can be used as the organic semiconductor material. In this case the organic semiconductor material is applied to the insulation layer 15 by means of one of the above-described processes in fluid or dissolved form or as a suspension and then solidified. In that case it is also possible for the layer 16 to be structured in a pattern configuration in the same manner as the first electrode layer, thereby affording the shaping of the layer 16 shown in FIGS. 1 and 2.

The second electrode layer with the source and drain electrodes 17 and 19 respectively is then applied to the layer 16 in the same manner as described hereinbefore. In regard to the materials and structuring processes used for this layer, attention is directed to the description relating to the first electrode layer.

The lacquer layer 18 and the adhesive layer 20 are then applied over the full surface area. The thickness of the layer 18 is preferably 2-10 μm. The adhesive layer 20 is an adhesive layer which is per se known and usual in relation to transfer films or hot stamping films, of a thickness of between about 1 and 10 μm, wherein the adhesive layer for a hot stamping film is of such a composition that it only becomes sticky when subjected to the corresponding action of heat.

The layers 12, 13, 18 and 20 can be produced in accordance with the following compositions:

Release Layer 12 (Separating Layer):

| | |
|---|---|
| Toluene | 99.5 parts |
| Ester wax (dropping point 90° C.) | 0.5 part |

-continued

| Lacquer layer 13 (protective lacquer layer): | |
|---|---|
| Methylethylketone | 61.0 parts |
| Diacetone alcohol | 9.0 parts |
| Methyl methane acrylate (Tg = 122° C.) | 18.0 parts |
| Polyethylene dispersion (23% in xylene) (softening point 140° C.) | 7.5 parts |
| High-molecular dispersing additive (40%, amine index 20) | 0.5 part |
| Extender (aluminum silicate) | 20.0 parts |
| Lacquer layer 18 (intermediate layer): | |
| Methylethylketone | 40.0 parts |
| Toluene | 22.0 parts |
| Ethylene vinyl acetate terpolymer (mp = 60° C.) | 2.5 parts |
| Polyvinylchloride (Tg: 89° C.) | 5.5 parts |
| Polyvinylchloride (Tg: 40° C.) | 3.0 parts |
| Dispersing additive (50%, acid number 51) | 1.0 part |
| Titanium dioxide (d = 3.8-4.2 g/cm$^3$) | 26.0 parts |
| Adhesive layer 20: | |
| Methylethylketone | 55.0 parts |
| Toluene | 12.5 parts |
| Ethanol | 3.5 parts |
| Polyvinyl acetate (softening point 80° C.) | 6.0 parts |
| Butyl-/methylmethacrylate (Tg: 80° C.) | 8.0 parts |
| Ethyl methacrylic resin (Tg: 63° C.) | 3.0 parts |
| Methacrylate copolymers (Tg: 800C) | 5.0 parts |
| Unsaturated polyester resin (softening point 103° C.) | 3.5 parts |
| Silicon dioxide | 3.5 parts |

The lacquer layers 13 and 18 here have on the one hand electrically insulating properties while in addition they perform the function of protection layers for the electrical functional polymer layers enclosed thereby.

It would also be possible to omit the first lacquer layer 13 and the second lacquer layer 18.

In this respect organic semiconductor materials, organically conductive materials and organic insulation materials are formed by organic, metallorganic and/or inorganic plastic materials which have the respective electrical properties. In this respect those organic, metallorganic and/or inorganic materials which can be used in the construction of components using organic semiconductor technology can be used as functional polymers. The term functional polymer accordingly also includes non-polymer components.

The portion of the film 1 shown in FIG. 1 has the gate electrode 14, the source electrode 17 and the drain electrode 19 so that an organic field effect transistor is implemented by the region shown in FIG. 1 of the film 1 by the co-operation of those electrodes with the insulation layer 15 and the layer 16 comprising an organic semiconductor material. Depending on the respective structuring of the first and second electrode layers and under some circumstances the structuring of the insulation layer 15 and the layer 16 comprising a semiconductor material, it is possible to implement in the film 1 a complex electronic circuit comprising a plurality of components produced using organic semiconductor technology.

In this respect, the term component produced using organic semiconductor technology is used to denote an electronic component which includes an organic semiconductor layer or semiconductor layer region as a functional component part, for example transistors, FETs, triacs, diodes and so forth.

In this respect it is also possible for a plurality of the layers 13 through 16 shown in FIG. 1 to be arranged in mutually superposed relationship in order in that way to embody two or more mutually superposed components produced using organic semiconductor technology in the film 1.

To produce the components using organic semiconductor technology, it is possible in this case for both the first electrode layer and also the second electrode layer to be produced in a form structured in a pattern configuration, as already indicated above. It is however also possible for the insulation layer 15 and the layer 16 comprising a semiconductor material also to be produced in the form involving structuring in a pattern configuration in order to achieve the corresponding electrical functionality. In that respect, the following processes or a combination of the following processes are proposed for such patterned structurings:

It is proposed that the electrode, insulation and semiconducting layers required for the function of the components are introduced into a film structure over the entire surface area or part of the area thereof by printing processes.

The high-resolution printing processes known for printing over a partial area at the present time however involve a lateral resolution of 50 μm and are therefore only limitedly suitable for the production in particular of the source and drain electrodes.

Figure 3:
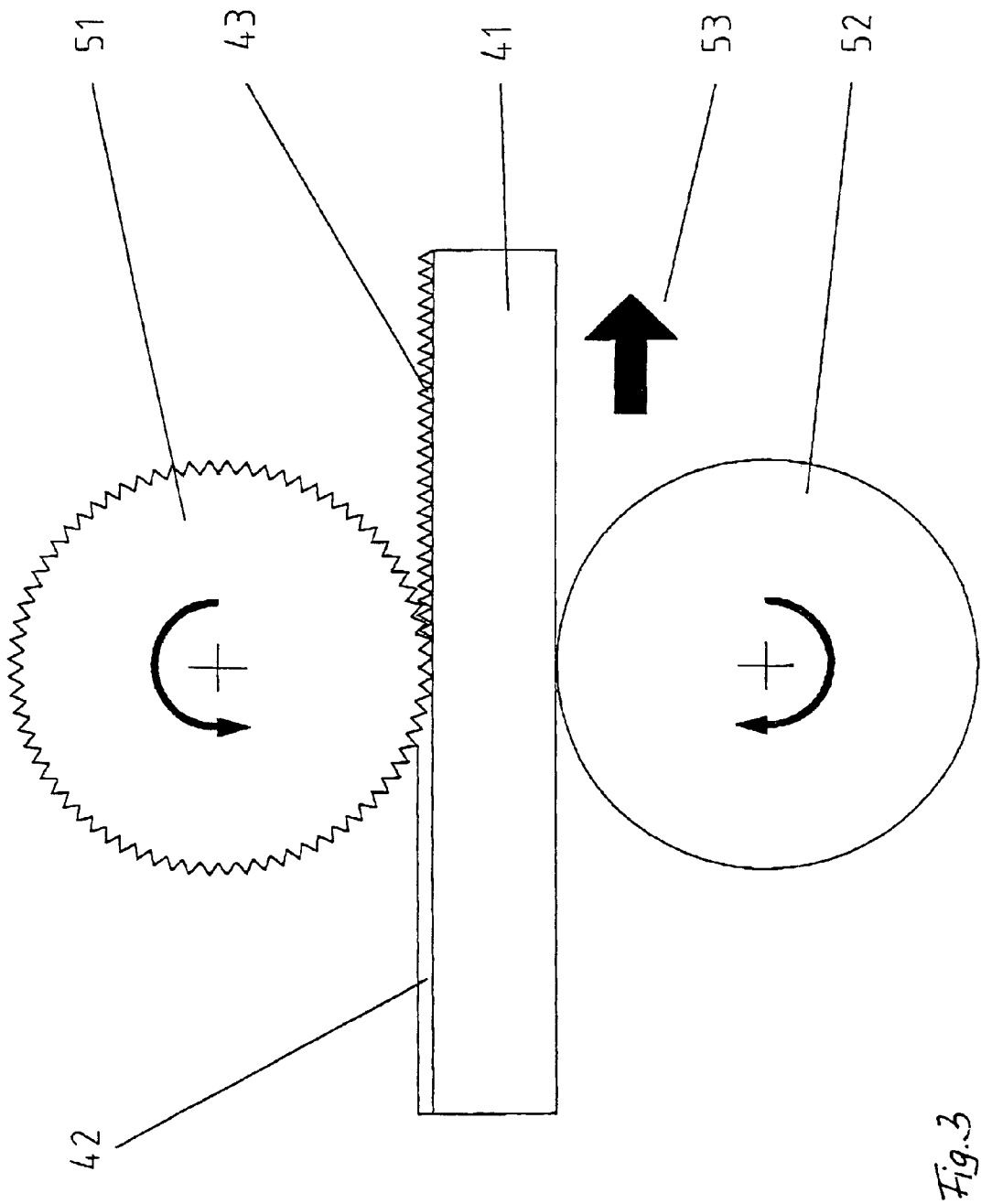
FIG. 3 shows a view of an apparatus for the replication of structures of electrical components using organic semiconductor technology, in particular organic field effect transistors.
Figure 4A:
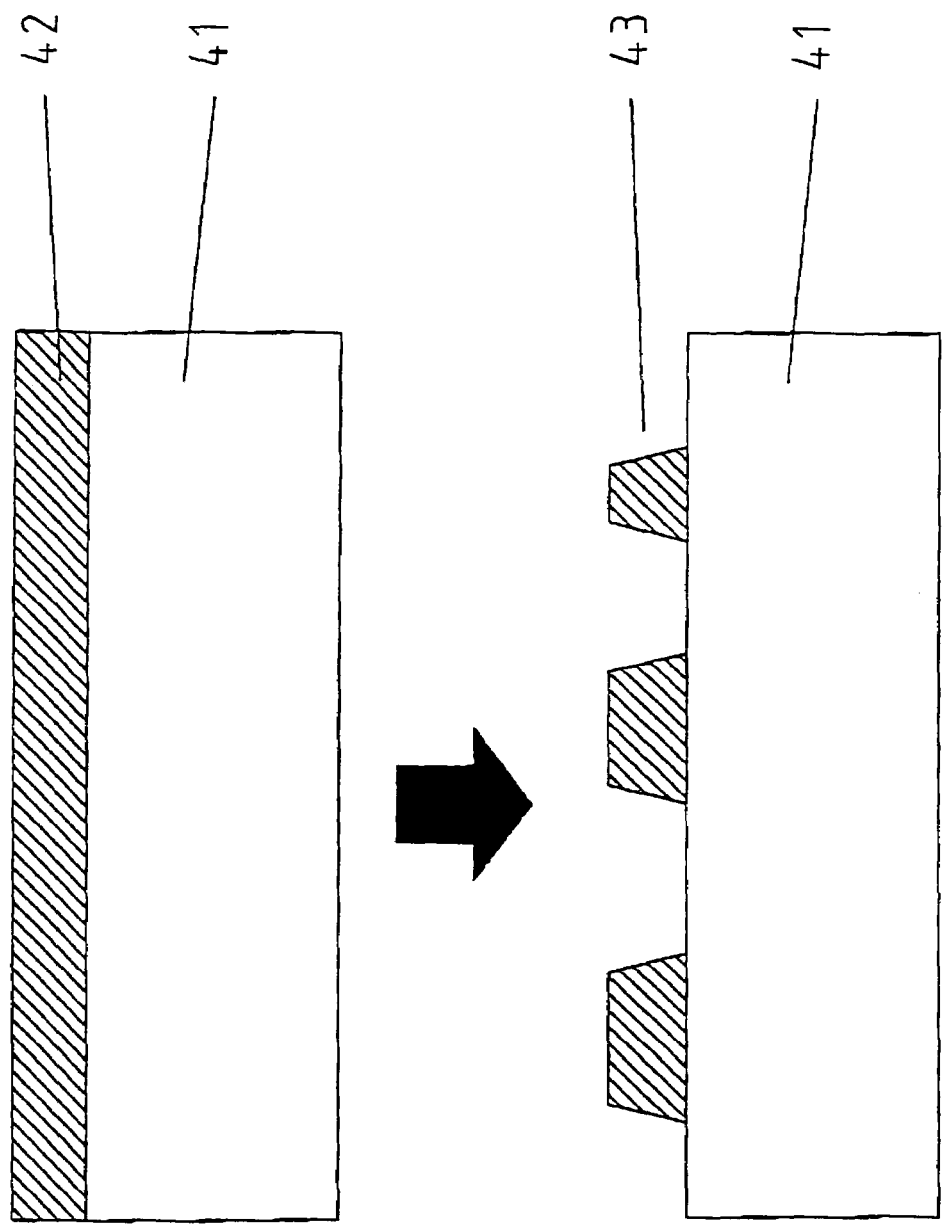
FIG. 4a shows a functional view of the structuring of a layer of a component using organic semiconductor technology in accordance with a first embodiment.
Figure 4B:
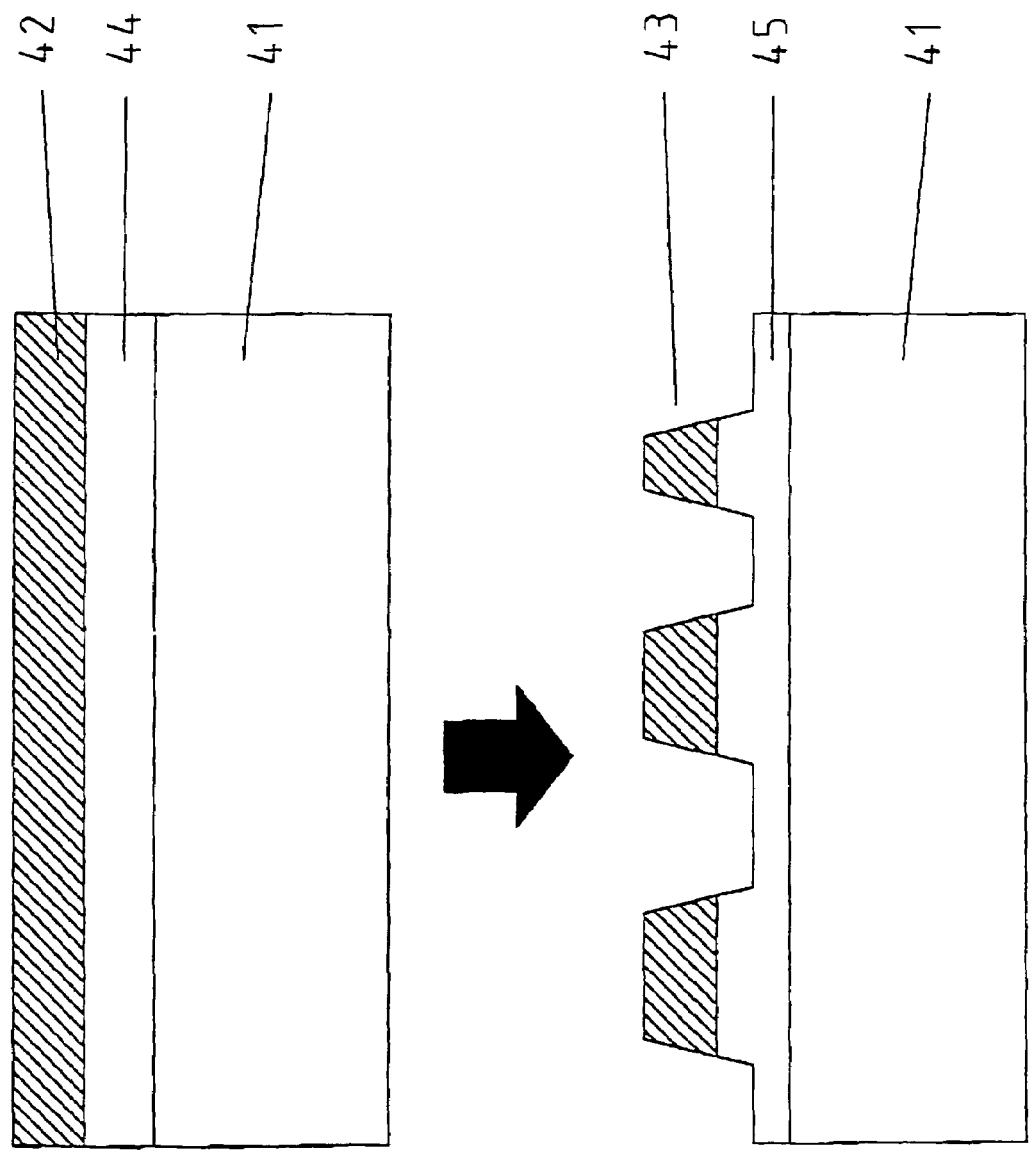
FIGS. 4b and 4c show functional detail views of the structuring of a layer in accordance with the first embodiment.
Figure 4C:
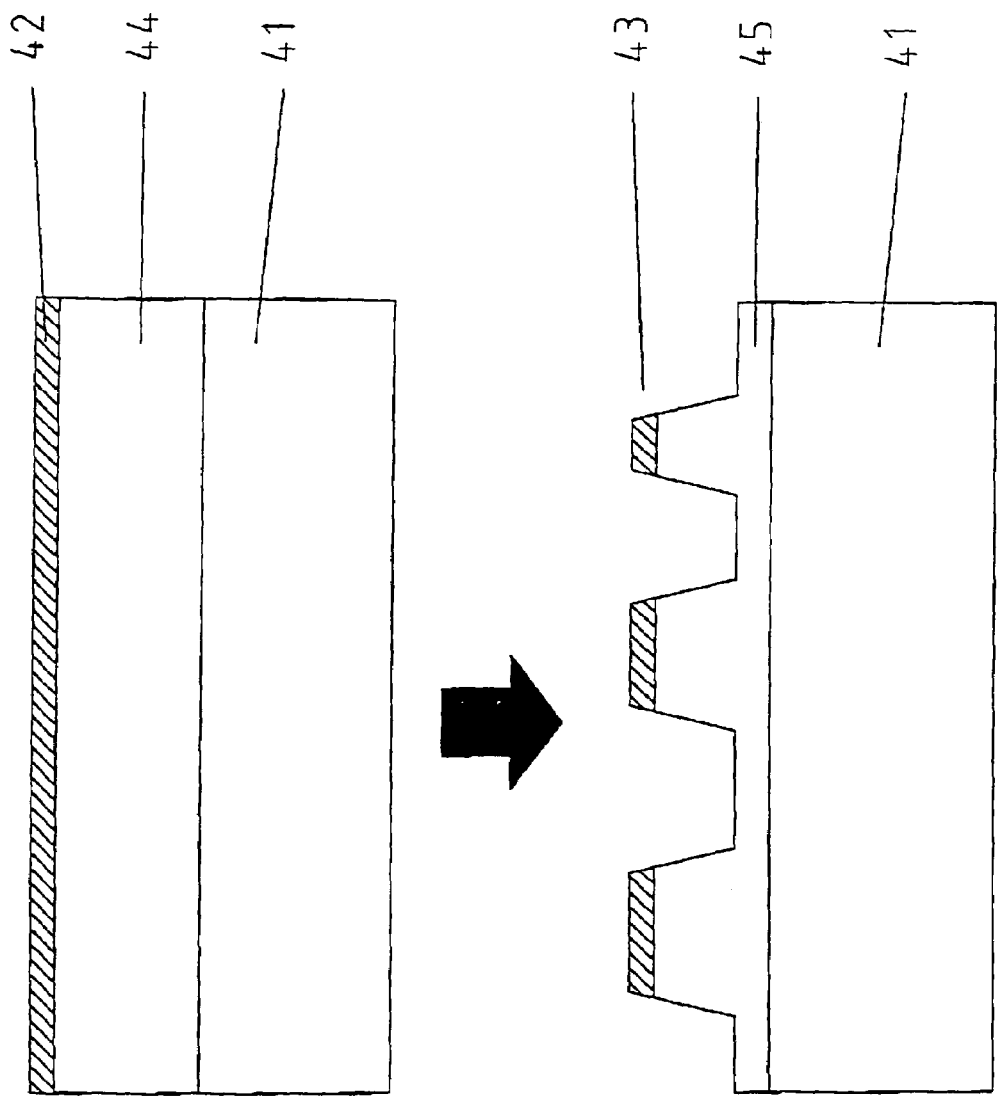

In the case of the process which is preferred herein in contrast it is provided that firstly printing over the full surface area is effected, and then suitable structuring of the layer is effected by thermal or UV replication. A suitable apparatus for that purpose is shown in FIG. 3 and the result is illustrated in FIGS. 4a through 4c. In addition, an UV lamp (not shown) and a mask (also not shown) are to be provided for the UV replication operation. Very high levels of lateral resolution in the range of between 0.5 μm and 5 μm are achieved by replication processes of that kind.

FIG. 3 shows a replication roller 51, a counterpressure roller 52, a carrier film 41, a layer 42 and a structured layer 43. The film body comprising the layer 42 and the carrier film 41 is conveyed in the feed direction 53 upon rotation of the replication roller 51 and the counterpressure roller 52 in the direction indicated in FIG. 3. In this case, as shown in FIG. 3, a structure is replicated in the layer 42 so that the layer 42 acquires the structure shown in FIG. 3 and now forms the structured layer 43.

The layer 42 is a functional layer of a component produced using organic semiconductor technology, for example a layer of the organic field effect transistor shown in FIGS. 1 and 2, for example the first electrode layer, the layer comprising an insulation material, the second electrode layer or the layer comprising an organic semiconductor material. The carrier film 41 can be the carrier film 11 or a multi-layer film body with the carrier film 11 and one or more layers disposed thereover, for example a multi-layer film body with the carrier film 11, the release layer 12 and the lacquer layer 13.

Preferably thermal replication and UV replication are used as the replication process.

In the thermal replication procedure, replication is effected by thermal deformation of the layer 42. A material having thermoplastic properties is used for the layer 42. A structure which corresponds to the surface shape of the replication roller 51 is then embossed into the layer 42 by means of the heated replication roller 51.

By way of example a polyaniline or polypyrrole solution involving an application weight of 2.2 g/m$^2$ after drying is applied to the film body of the carrier film 41 by means of an intaglio printing raster roller. In this case drying is effected in the drying passage at a temperature of between 100 and 120° C. The structure is then embossed into the layer 42 at about 130° C. by means of the replication roller which for example comprises nickel. In that case the replication roller is preferably electrically heated for embossing the structure. Instead of a replication roller it is also possible here to use a replication die. Such a die can be cooled down again before being lifted off the layer 42. After the structure has been embossed the layer 43 then hardens by cross-linking or in some other manner.

An UV-hardenable material is used for the layer 42 in the UV replication procedure. Provided within the replication roller 51 or downstream of the replication roller 51 is an UV lamp which causes hardening of the layer 43 shaped in accordance with the surface structure of the replication roller 51. It is also possible for the replication roller 51 to have a smooth surface which partially exposes the layer 42, in the form of a mask. The layer 42 hardens in the exposed regions. The layer 42 does not harden in the non-exposed regions and is removed in a washing process, thus giving the structuring for the layer 43, shown in FIG. 3.

As shown in FIG. 4*a*, in this case a spatial structure is replicated in the layer 42, the depth of the structure being greater than or equal to the thickness of the layer to be replicated. The layer 42 to be replicated is thus in part completely severed by the replication procedure, thereby affording an electrical functional layer 43 which is structured in a pattern configuration in accordance with the spatial structure.

In this respect it is particularly preferred for the structure depth in the thermal replication operation to be greater than the thickness of the layer 42. In this respect it is advantageous, as shown in FIG. 4*b*, for a further lacquer layer 44, preferably comprising a replication lacquer, to be disposed beneath the layer 42. The stamping die of the replication roller can thus stamp through the layer 42 without damage to the carrier film beneath the lacquer layer 44 or further layers being observed. FIG. 4*c* shows an embodiment in which the thickness of the layer 42 is very much less than the replication depth. That ensures that reliable separation of the regions of the electrical functional layer 43 is achieved.

Figure 5:
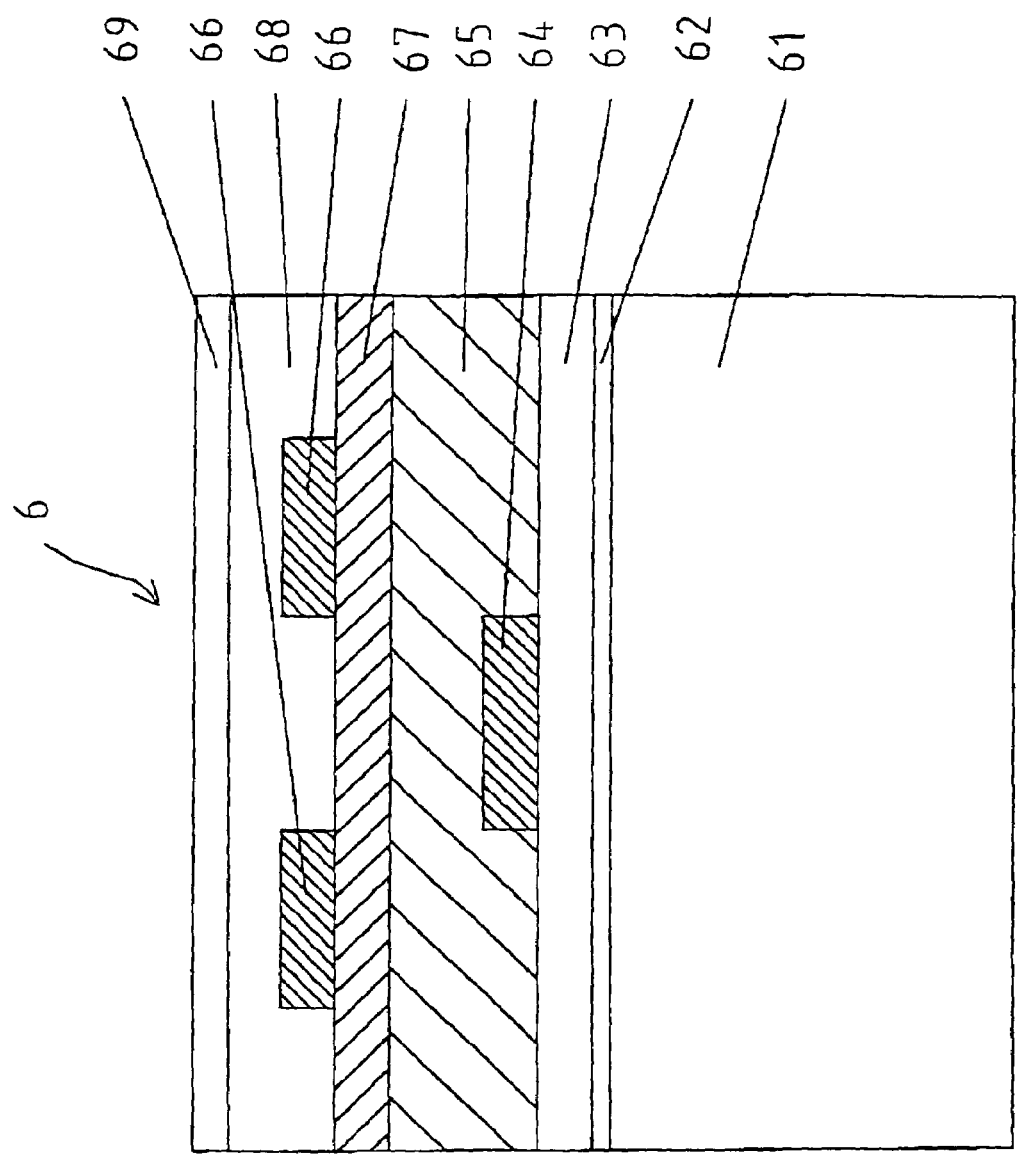
FIG. 5 shows a sectional view of a film according to the invention in which one or more layers of a component produced using organic semiconductor technology are replicated, in accordance with the process shown in FIG. 4, FIG. 6a through FIG. 6e show functional views of the structuring of a layer of a component produced using organic semiconductor technology by replication in accordance with a further embodiment.

FIG. 5 now shows a stamping film 6 in which the first and second electrode layers have been structured in a pattern configuration by means of the process shown in FIG. 3 through FIG. 4*c*.

FIG. 5 shows the stamping film 6 comprising a carrier film 61, a release layer 62, a lacquer layer 63, a first electrode layer 64, an insulation layer 65, a layer 67 comprising an organic semiconductor material, a second electrode layer 66, a lacquer layer 68 and an adhesive layer 69.

The lacquer layer 63 comprises a replication lacquer. The first electrode layer 64 is applied to the lacquer layer 63 over the full surface area involved and is then structured in a pattern configuration by means of the replication process described with reference to FIG. 3 and FIG. 4*a*, FIG. 4*b* or FIG. 4*c*. The insulation layer 65 is then applied over the full surface area involved. Then, the layer 67 comprising an organic semiconductor material is applied over the full surface area. A second electrode layer 62 is applied thereto and in turn structured in a pattern configuration by means of the replication process of FIG. 3 through FIG. 4*c*. It is also possible for the second electrode layer 66 to be partially applied by printing and coating processes, in particular if the source and gate electrodes are arranged downwardly in the layer structure and the gate electrode is arranged upwardly therein.

The layers 68 and 69 are then applied over the full surface area.

As already mentioned above however it is also possible for both the insulation layer 65 and also the layer 67 comprising an organic semiconductor material to be structured in a pattern configuration by means of the processes of FIG. 3 through FIG. 4*c*, and thus it is possible for more complex electronic circuits to be implemented in the stamping film 6.

Figure 6B:
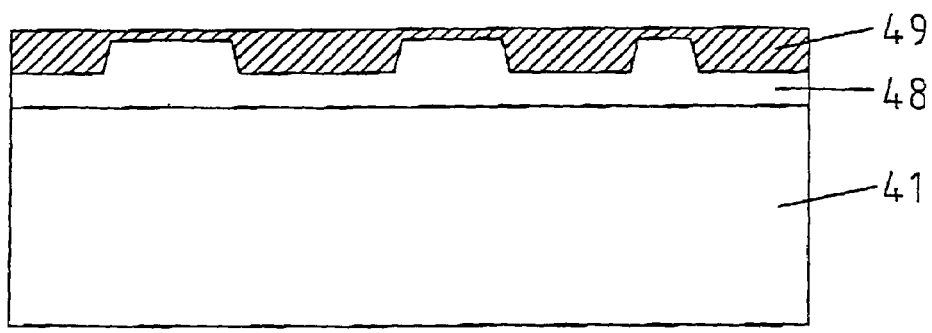

In addition it is also possible to replicate in the layer to be replicated a spatial structure whose structure depth is less than the thickness of the layer to be replicated. That is shown by way of example in FIG. 6*a*. Thus, the replication processes described with reference to FIG. 3 are used to replicate into the layer 42 a structure which does not penetrate through the layer 42 and thus affords the layer 48 shown in FIG. 6*a* as the replication result. Now, as shown in FIG. 6*b*, in a next step, an electrical functional layer 49 is applied to the structured layer 48 by being printed thereon, coating or spraying thereon. In that respect, a material of high viscosity is used for the electrical functional layer 49 so that the recesses of the layer 48 are completely filled by the layer 49. In addition, a material which experiences a pre-defined reduction in volume upon hardening is used for the electrical functional layer 49. Thus for example it is possible to use an UV-hardenable material, preferably an acrylate system which, upon UV hardening, experiences a shrinkage in volume which is clearly defined beforehand. In addition the shrinkage in volume can also be achieved by evaporation of the solvent in which the functional polymer used is dissolved.

In this case the material of the layer 49 is applied in an application amount per unit of surface area, with which on the one hand the recesses of the layer 48 are completely filled by the material of the layer 49 but on the other hand, upon hardening of the layer 49, there is a shrinkage in volume which has the result that the layer 49 now entirely or partially fills the recesses in the layer 48 but no longer covers the plateaux of the layer 48. That is shown for example in FIG. 6*c* where it can be seen that, after hardening, the layer 49 only fills the recesses of the layer 48 to a degree of 95%. That provides that, after hardening of the layer 49, there remains an electrical functional layer 49 which is structured in a pattern configuration in accordance with the replicated structure.

Figure 6C:
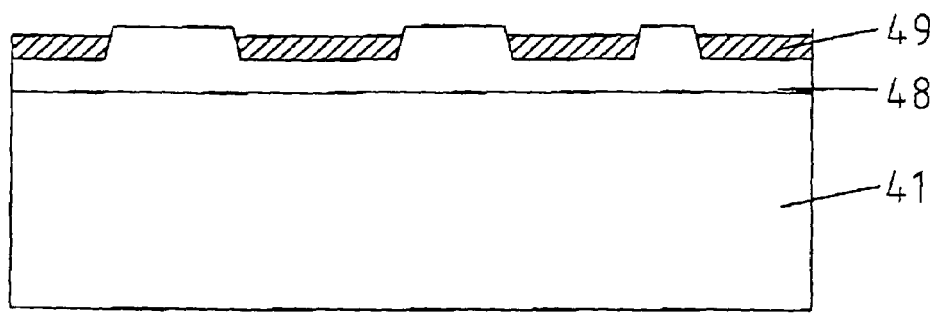
Figure 6D:
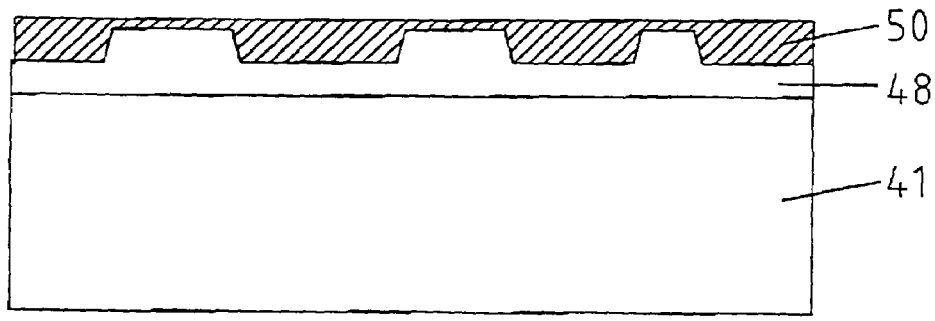
Figure 6E:
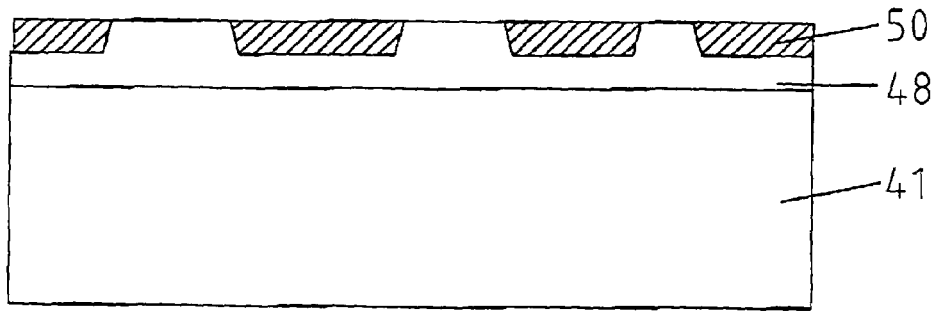

Alternatively or additionally it is also possible, as shown in FIG. 6*d*, to apply to the layer 48 an electrical functional layer 50 which, after hardening, completely covers the layer 48, and then to remove the layer 50 over the entire surface area involved, as shown in FIG. 6*e*, to a depth such that there remains an electrical functional layer 50 which is structured in a pattern configuration in accordance with the replicated structure. Removal of the functional layer 50 can be effected here for example by etching or some other ablation process, for example by laser ablation.

The layers 49 and 50 can each involve a respective organic insulation layer, a layer comprising an organically conductive material or a layer comprising an organic semiconductor material which is used as a functional layer of a component produced using organic semiconductor technology. The layer 48 can also be such a functional layer or an auxiliary layer which only promotes the structuring of an electrical functional layer.

Figure 7:
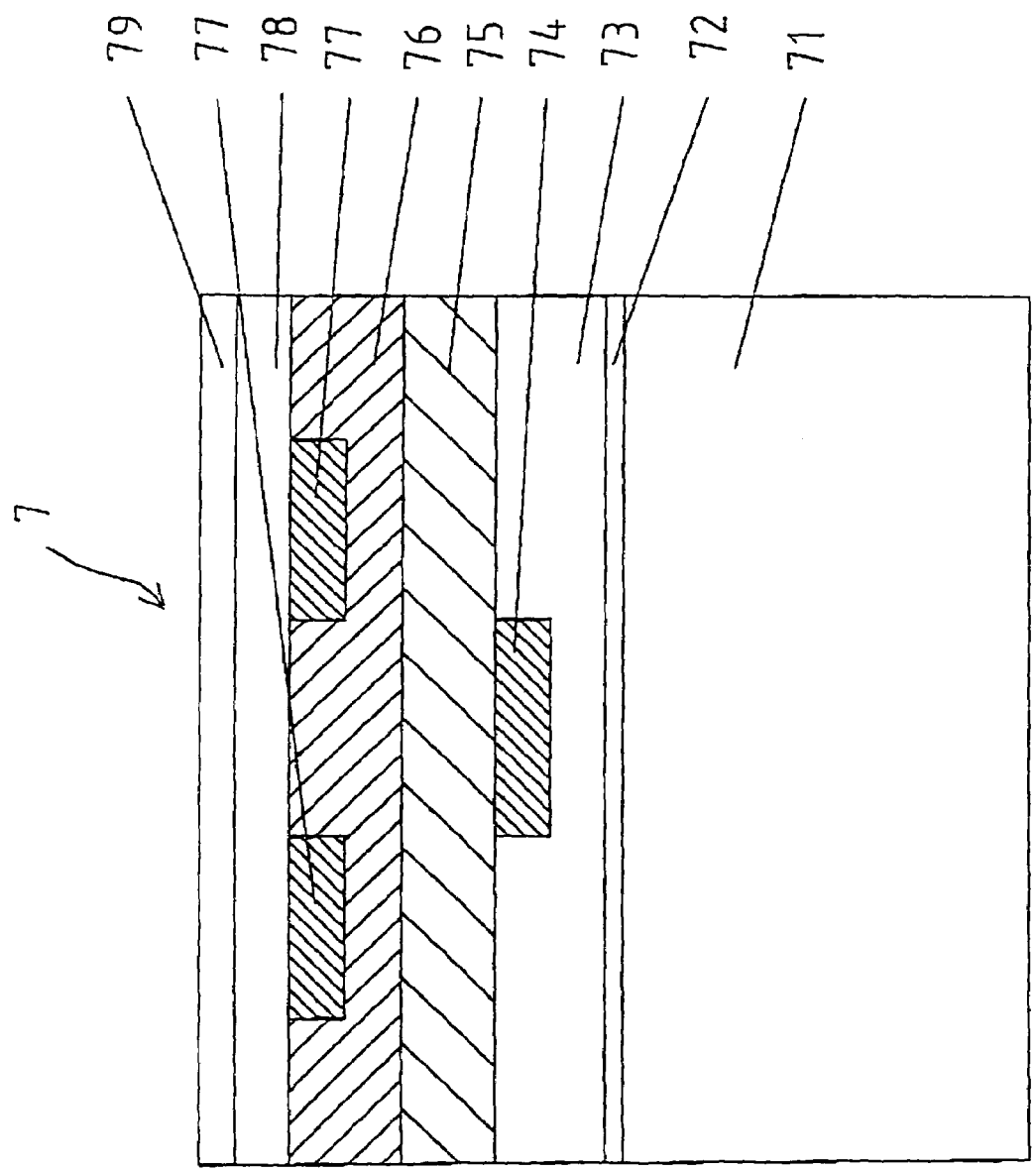
FIG. 7 shows a sectional view of a film in which one or more layers of a component produced using organic semiconductor technology are structured in accordance with the processes shown in FIGS. 6a through 6e.

FIG. 7 now shows an embodiment of a film according to the invention which has electrical functional layers which have been structured in a pattern configuration in accordance with the process described With reference to FIG. 6*a* through FIG. 6*e*.

FIG. 7 shows a stamping film 7 comprising a carrier film 71, a release layer 72, a lacquer layer 73, an insulation layer 75, a layer 76 comprising an organic semiconductor material, two electrode layers 74 and 77, a lacquer layer 78 and an adhesive layer 79.

The layer 73 is formed by a replication lacquer layer comprising a transparent thermoplastic material.

By way of example the lacquer layer 73 can be of the following composition:

| Component | Parts by weight |
| --- | --- |
| High-molecular PMMA resin | 2000 |
| Silicone alkyd, oil-free | 300 |
| Non-ionic wetting agent | 50 |
| Low-viscosity nitrocellulose | 750 |
| Methylethylketone | 1200 |
| Toluene | 2000 |
| Diacetone alcohol | 2500 |

A spatial structure is now replicated in the layer 73, the layer 74 comprising an organically conductive material, for example polyaniline or polypyrrole, is applied by means of a coating process and then hardened, thus giving the effect described with reference to FIGS. 6b and 6c. The insulation layer 75 is then applied over the full surface area, for example by means of a printing process. In that case the insulation layer 75 can comprise the same material as the lacquer layer 73. The layer 76 comprising an organic semiconductor material, for example polythiophene, is then applied by printing over the entire surface area involved. A structure is now replicated into the layer 76, the layer 77 comprising an electrically conductive material is applied and hardened, giving the effect described with reference to FIG. 6b and FIG. 6c. The lacquer layers 78 and the adhesive layer 79 are then applied by printing over the full surface area involved, for example by means of an intaglio printing roller.

It will be appreciated that it is also possible for the shaping layer described in the state of the art to be produced by replication processes and for structuring of the OFET layers to then be effected using the doctor or scraper process. In regard to that state of the art, attention is directed to the state of the art referred to in the preamble to the description.

It will be appreciated moreover that it is possible to envisage additional layers (not shown in FIGS. 1 and 2), in particular holographic-optical layers, optically effective thin-film layers, protection layers and so forth.

In that respect it is advantageous for the electrical functionality (of the organic semiconductor circuit) to be combined with optical features. Both are produced in one step during the replication procedure, as is illustrated in FIG. 8a. It is in particular possible for the component structures provided with the diffractive-optical structures to be arranged in such a way that a particular optical impression, for example a corporate logo, is produced. A particular degree of safeguard against forgery is afforded by virtue of the fact that the diffractive structures can be arranged at different heightwise positions in the layer system, in particular also in mutually superposed relationship. The optical-electrical element which is produced in that way is accordingly excellently well suited as a security element for banknotes, documents and for safeguarding articles and data carriers in relation to forgery.

FIG. 8a now shows the functional representation of a replication procedure in which a diffractive optical structure for an optical security feature and a structuring of an electrical functional layer are produced at the same time. Thus FIG. 8a shows the carrier film 41 and the layer 42 shown in FIG. 4a, FIG. 4b, FIG. 4c or FIG. 6a. As shown in FIG. 8a, replicated in the layer 42 is a structure 47 which is composed of the superimposition of a macrostructure and a microstructure. The macrostructure results in structuring of the layer 42 in a pattern configuration, thus giving the electrical functional layer which is structured in a pattern. The microstructure describes fine structuring of the surface of the replicated layer 46. The microstructure is preferably formed by a diffractive-optical structure which for example generates a hologram or optical-diffraction effects such as a kinegram, kineform or the like. It will be appreciated that the microstructure can also involve a zero-order diffraction structure which produces specific color and color tilt effects. In addition it is also possible for the microstructure to be formed by an isotropic or an anisotropic matt structure.

Figure 8B:
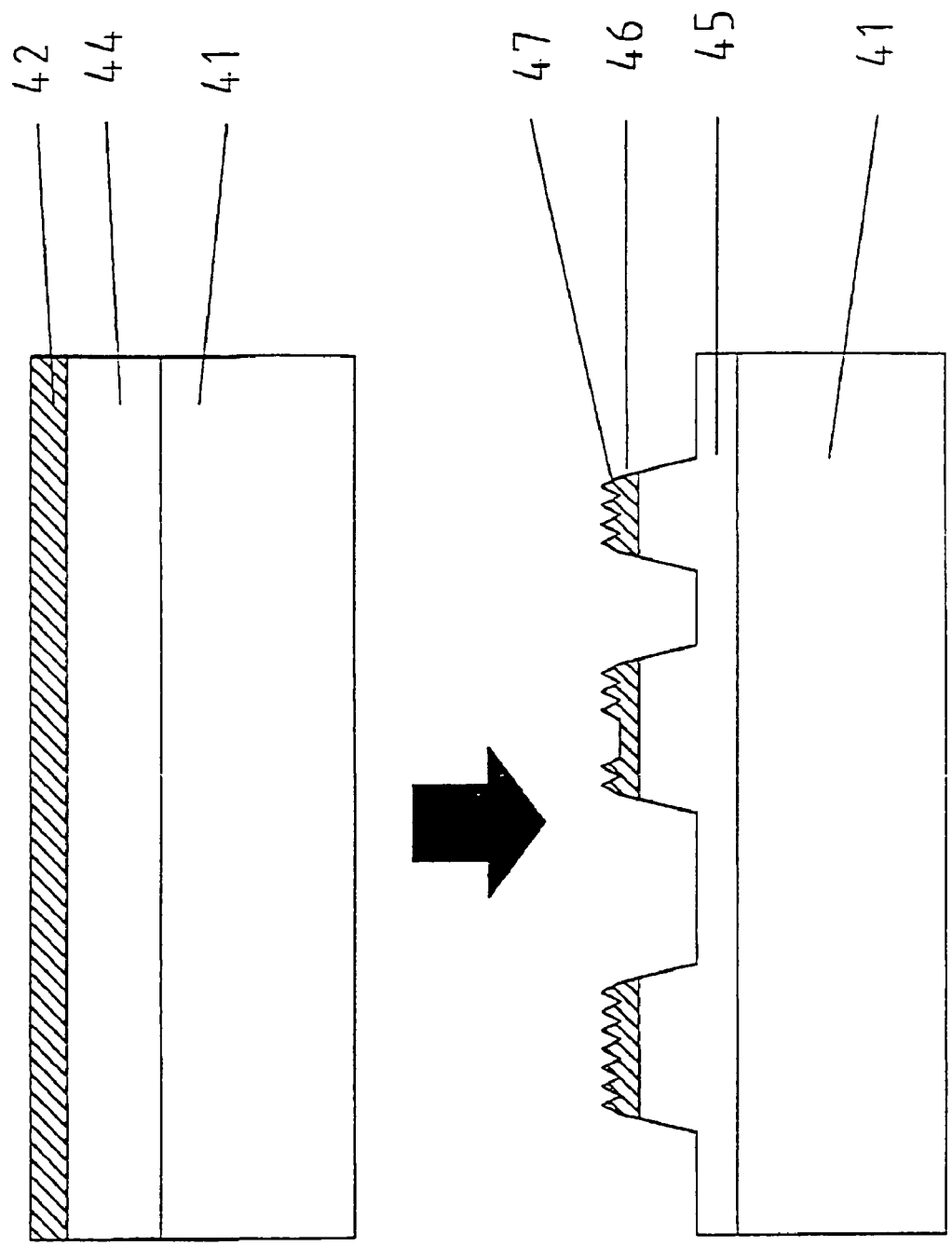
FIG. 8b shows a functional view of the replication of a layer of a component produced using organic semiconductor technology in accordance with a further embodiment.

In that respect it is particularly preferred that, in the case of thermal replication, the structure depth is greater than the thickness of the layer 42. In that respect it is advantageous, as shown in FIG. 8b, to provide a further lacquer layer 44, preferably comprising a replication lacquer, beneath the layer 42. The stamping die of the replication roller can stamp through the layer 42 in that way, without damage to the carrier film or further layers beneath the lacquer layers 44 being observed.

There is then applied to the layer 46 a (lacquer) layer comprising a material whose refractive index differs markedly from that of the material used for the layer 46 so that the optical effects generated by the microstructure become visible to a person viewing the film. Alternatively a reflection layer can be additionally applied to the layer 46, in the form of a completely or partially applied metal layer or HRI layer (HRI=high refraction index). Chromium, aluminum, copper, iron, nickel, silver, gold or an alloy with those materials are essentially considered as materials for the reflection layer.

Figure 9A:
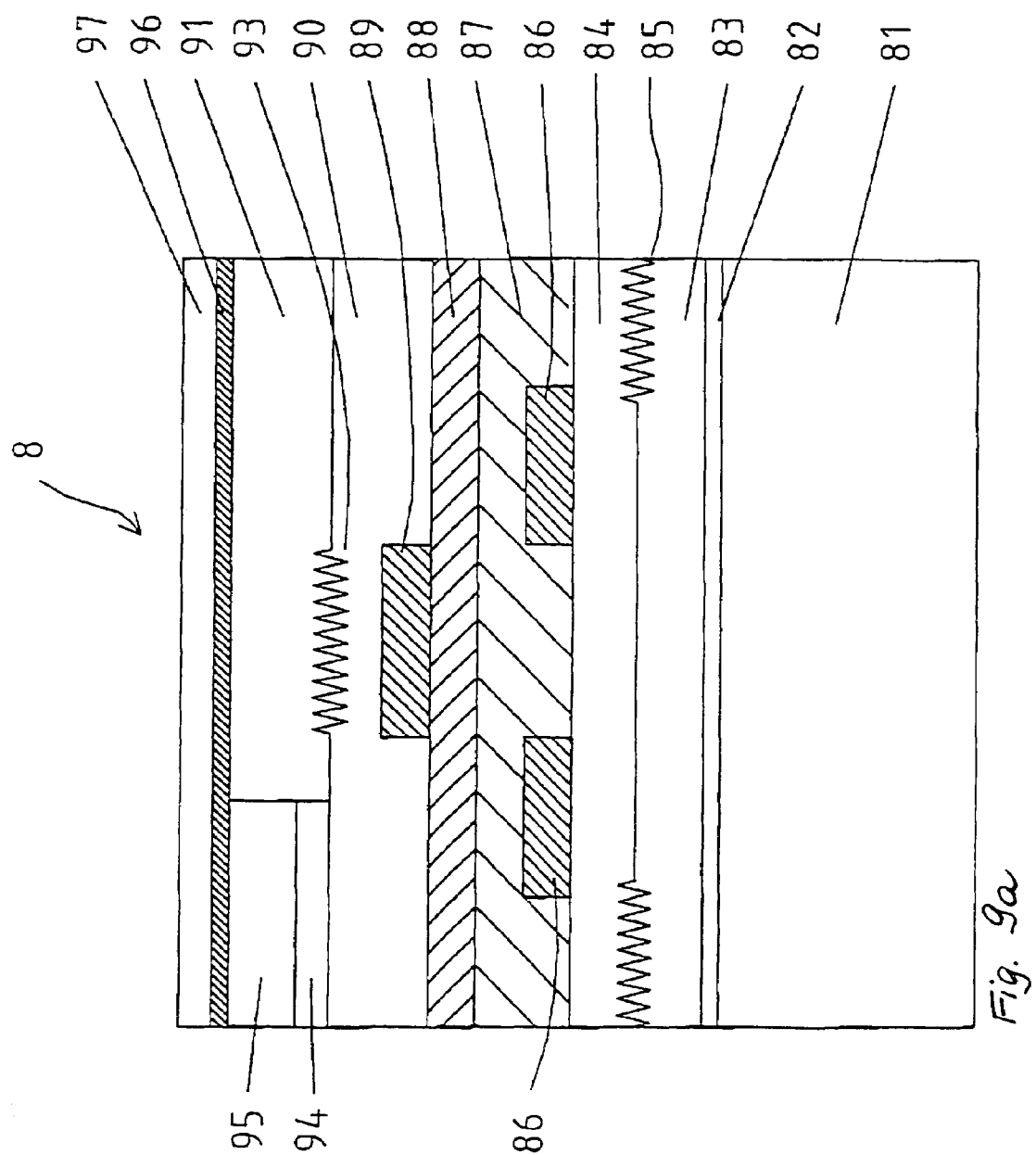
FIG. 9a and FIG. 9b show sectional views of films according to the invention for further embodiments of the invention.

FIG. 9a now shows a further possible way of combining within a film functions of an electronic component produced using electronic semiconductor technology with optical security features.

FIG. 9a shows a stamping film 8 comprising a carrier film 81, a release layer 82, two lacquer layers 83 and 84, a first electrode layer 86, an insulation layer 87, a layer 88 comprising an organic semiconductor material, a second electrode layer 89, a lacquer layer 90, a lacquer layer 91, a thin film layer system comprising an absorption layer 94, and a spacer layer 95, a reflection layer 96 and an adhesive layer 97.

The first and second electrode layers 86 and 89, the insulation layer 87 and the layer 88 comprising an organic semiconductor material are like the corresponding layers shown in FIGS. 1 and 2. Structuring of the electrode layers 86 and 89 can be effected for example by means of the replication processes described with reference to FIG. 3 through FIG. 4c.

The layer 83 is a replication lacquer layer in which an optical-diffraction structure 85 is embossed. The lacquer layer 84 is then applied, comprising a material whose refractive index differs markedly from that of the lacquer layer 83. As shown in FIG. 9a, the diffraction structure 85 does not cover the entire surface area but only part thereof. The layer 90 also involves a replication layer in which an optical-diffraction structure 93 is embossed. The lacquer layer 91 is partially applied in a pattern configuration to the layer 90, the refractive index of the layer 91 differing markedly from that of the layer 90. The optical-diffraction structure 93 is also only partially provided so that the optical feature produced by the optical-diffraction structure 93 is superimposed with and supplemented by the optical feature produced by the structure 85.

The thin film layer system comprises the absorption layer 94 (preferably with 30% through 65% transmission), the transparent spacer layer 85 as a color change-producing layer (for example a λ-quarter or λ-half layer) and the reflection layer 96 or an optical separating layer if the thin-film layer system is to act as a transmitting element.

The layers 94, 95 and 96 produce a color shift which is dependent on viewing angle, by means of interference. The color shifts produced by the thin-film layer system are in that case preferably in the range of light which is visible to a human viewer.

It is further possible for a thin film element to be made up of a succession of high-refraction and low-refraction layers. For example such a thin film element can be made up of between three and nine such layers or between two and ten such layers. The higher the number of layers involved, the correspondingly sharper is it possible to adjust the wavelengths for the color change effect.

The reflection layer 96 can be in the form of a full-area or partial metal layer or HRI layer (HRI=high refraction index). Thus chromium, aluminum, copper, iron, nickel, silver, gold or an alloy with those materials can essentially be considered as materials for the reflection layer.

It is also possible for the lacquer layers 83, 84, 90 and 91 to be colored. The layers 86, 87, 88 and 89 are preferably transparent or colored over the full surface area so that those electrical functional layers do not influence the optical impression of the film element. It will be appreciated that it is also possible that, upon replication of the electrode layers 86 and 87, a replication process as described with reference to FIG. 8a or FIG. 8b is adopted, so that the optical effects indicated hereinbefore in FIG. 9a are also superimposed by additional optical effects. In this case also it is advantageous for the optical effects produced in that way to be supplemented for example by the optical effects produced by the diffractive structures 85 and 93, whereby manipulation of or alteration to one of those effects is immediately noticeable for the viewer.

It will be appreciated that it is also possible that not all of the optical effects described with reference to FIG. 9a are embodied in a film according to the invention, but that only a selection of such effects is implemented in such a film.

Figure 9B:
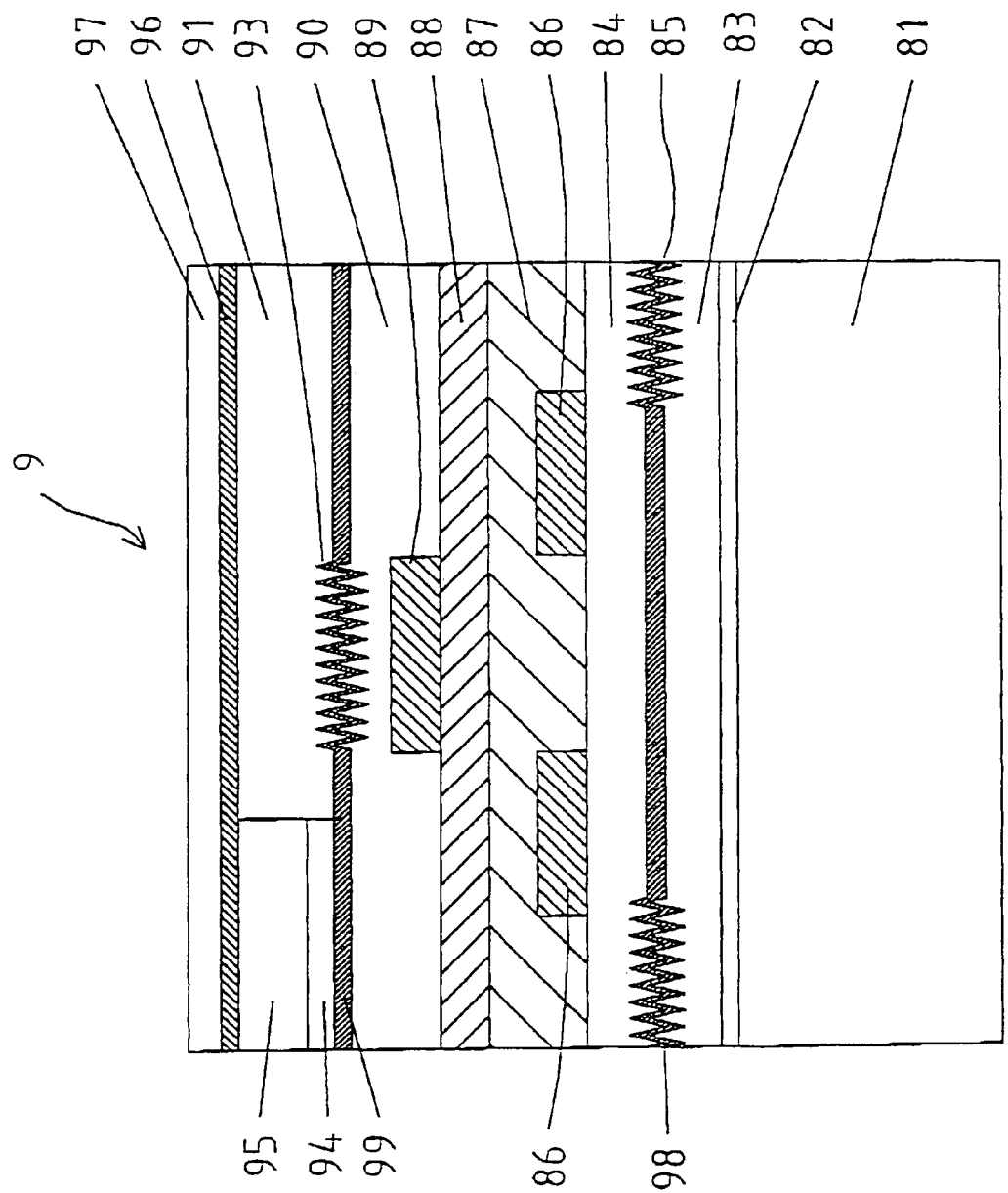

FIG. 9b shows a variant of the film structure in which additional reflection layers 98 and 99 are applied in the form of metal layers or HRI layers to the layer 83 or the layer 90 respectively over the full surface area involved or partially. In that case there is no need for the refractive indices of the materials used for the layers 84 and 83 to differ. Equally there is no need for the refractive indices of the materials used for the layer 90 and the layer 91 respectively to differ.

The invention claimed is:

1. A process for the production of a film comprising:
producing at least one component using organic semiconductor technology, wherein the at least one component includes a plurality of layers and wherein the plurality of layers includes at least one electrical functional layer; and
spatially structuring one or more of the plurality of layers by means of thermal replication or UV replication to form a spatial structure in a replicated layer, wherein a part of at least one electrical functional layer is completely severed in the region of the spatial structure and wherein the spatial structure has a structure depth that is greater than the thickness of the replicated layer, so that the replicated layer is completely severed in part by the replication operation and an electrical functional layer which is structured in a pattern configuration in accordance with the spatial structure is formed.

2. The process as set forth in claim 1, wherein the spatial structure is replicated in an electrode layer comprising an electrically conductive material and wherein the process further comprises applying a second electrical functional layer comprising a non-conducting or semiconducting material to said electrode layer.

3. The process as set forth in claim 1 further comprising applying to the replicated layer a second electrical functional layer of a material which upon hardening experiences a predefined reduction in volume, and that said material is applied to the replicated layer in an application amount with which upon hardening a functional layer which is structured in a pattern configuration in accordance with the spatial structure remains by virtue of the shrinkage in volume.

4. The process as set forth in claim 3, wherein the second functional layer comprises an UV-hardenable material.

5. The process as set forth in claim 1 further comprising applying a second electrical functional layer to the replicated layer and removing the second electrical functional layer to a depth such that there remains a functional layer which is structured in a pattern configuration in accordance with the spatial structure.

6. The process as set forth in claim 1, wherein the electrical functional layer comprises a non-conducting or semiconducting material and wherein the process farther comprises applying an electrode layer comprising a conductive material to said electrical functional layer.

7. The process as set forth in claim 1, wherein an electrical functionality and an optical functionality are produced by a replication operation.

8. A process for the production of a film comprising:
producing at least one component using organic semiconductor technology, wherein the at least one component includes a plurality of layers and wherein the plurality of layers includes at least one electrical functional layer; and
spatially structuring one or more of the plurality of layers by means of thermal replication or UV replication to form a spatial structure in a replicated layer, wherein a part of at least one electrical functional layer is completely severed in the region of the spatial structure, and wherein the spatial structure has a structure depth that is greater than the thickness of the replicated layer, so that the replicated layer is completely severed in part by the replication operation and an electrical functional layer which is structured in a pattern configuration in accordance with the spatial structure is formed,
wherein at least one of the plurality of layers is introduced into a film structure having a surface area over the entire surface area or part of the surface area by a printing process.

* * * * *

UNITED STATES PATENT AND TRADEMARK OFFICE
CERTIFICATE OF CORRECTION

| | | |
|---|---|---|
| PATENT NO. | : 7,655,498 B2 | Page 1 of 1 |
| APPLICATION NO. | : 10/529458 | |
| DATED | : February 2, 2010 | |
| INVENTOR(S) | : Lutz et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 975 days.

Signed and Sealed this

Twenty-eighth Day of December, 2010

David J. Kappos
*Director of the United States Patent and Trademark Office*